(12) United States Patent
Son et al.

(10) Patent No.: US 6,978,903 B2
(45) Date of Patent: Dec. 27, 2005

(54) APPARATUS FOR RECEIVING MODULE FOR USE IN COMPUTER

(75) Inventors: Kyoung Sun Son, Seoul (KR); Hyong Kon Kim, Suwon-si (KR); Byoung Yoon Jin, Suwon-si (KR)

(73) Assignee: LG Electronics Inc., Seoul (KR)

( * ) Notice: Subject to any disclaimer, the term of this patent is extended or adjusted under 35 U.S.C. 154(b) by 123 days.

(21) Appl. No.: 10/406,238

(22) Filed: Apr. 4, 2003

(65) Prior Publication Data

US 2003/0223201 A1    Dec. 4, 2003

(30) Foreign Application Priority Data

Apr. 4, 2002 (KR) ............... 10-2002-0018647
Oct. 16, 2002 (KR) ............... 10-2002-0063049
Nov. 11, 2002 (KR) ............... 10-2002-0069628

(51) Int. Cl.$^7$ ................................. A47F 7/00
(52) U.S. Cl. ...................................... 211/26
(58) Field of Search .............. 211/26; 361/683, 361/754, 685; 312/223.2; 439/159, 160

(56) References Cited

U.S. PATENT DOCUMENTS

| | | | | |
|---|---|---|---|---|
| 5,507,658 A | * | 4/1996 | Ho | 439/159 |
| 5,692,208 A | * | 11/1997 | Felcman et al. | 361/683 |
| 6,146,165 A | * | 11/2000 | Reich et al. | 439/159 |
| 6,210,188 B1 | * | 4/2001 | Chang | 439/159 |
| 6,252,514 B1 | * | 6/2001 | Nolan et al. | 340/686.4 |
| 6,332,658 B1 | * | 12/2001 | Sato et al. | 312/223.2 |
| 6,587,350 B1 | * | 7/2003 | Lin et al. | 361/754 |
| 6,637,846 B2 | * | 10/2003 | Yang | 312/223.2 |
| 6,643,139 B2 | * | 11/2003 | Tien | 361/727 |
| 6,667,879 B2 | * | 12/2003 | Salinas et al. | 361/685 |

FOREIGN PATENT DOCUMENTS

JP     5-189086 A     7/1993

* cited by examiner

Primary Examiner—Sarah Purol
(74) Attorney, Agent, or Firm—Birch, Stewart, Kolasch & Birch, LLP

(57) ABSTRACT

An apparatus for receiving a module for use in a computer includes a lever to which a user applies an external force. The module is drawn out and removed from the housing by the external force applied by the user. A locking piece for affixing the module or releasing the fixed module using the external force and a pushing arm permitting the module to be removed simply by pushing the module using the external force applied when the locking piece is released are also included in the apparatus.

14 Claims, 13 Drawing Sheets

APPARATUS FOR RECEIVING MODULE FOR USE IN COMPUTER

CROSS-REFERENCES TO RELATED APPLICATIONS

This non-provisional application claims priority under 35 U.S.C. § 119(a) on Patent Application Nos. 2002-0018647 filed in Korea on Apr. 4, 2002, 2002-0063049 filed in Korea on Oct. 16, 2002, and 2002-0069628 filed in Korea on Nov. 11, 2002, the entirety of each of which is herein incorporated by reference.

BACKGROUND OF THE INVENTION

1. Field of the Invention

The present invention relates to an apparatus for receiving a module for use in a computer, and more particularly to an apparatus for receiving a module for use in a computer capable of conveniently pushing a module by releasing a module from a locked position using a single button operation.

2. Description of the Background Art

In a computer, particularly in a portable computer such as a notebook computer, it is difficult to integrally mount all necessary peripheral devices on a computer. Accordingly, most of the modules for extension or peripheral use, e.g., a floppy disk drive(referred to as FD hereinafter) and/or a compact disk ROM(Read Only Memory) drive(referred to as CD-ROM hereinafter), are provided as separate devices.

Due to the restrictions in space on a portable computer, only indispensable or necessary peripheral devices are mounted on the computer system. In contrast, attachable and detachable modules are only mounted and used in the computer when necessary. Also, the attachable and detachable modules are inserted into a separate apparatus for receiving a module, e.g., a bay formed in the inside of the portable computer may be used for these peripheral attachments.

FIG. 1 is an exploded, perspective view of an apparatus for receiving a module for use in a computer of the background art. FIG. 1 shows a module within which a FD drive 11 is mounted. Referring to FIG. 1, the apparatus for receiving a module for use in a computer includes a module hooking part 13 positioned on a lateral portion of a module 10, a hooking part 22 positioned on a lateral portion of a bay 20 and engaged with the module hooking part 13 when the module is received, a drawing part 26 for drawing the module 10 toward the outside of the bay 20 if the locked hooking part 22 is released.

The module 10 generally includes peripheral devices such as a FD drive or CD-ROM drive, a case 15 inserted in the inside in advance, a module connector 14 formed in the rear side of the module 10 and connected to the bay 20 for performing signal exchange upon reception of the module 10 and a guide 12 formed on a lateral side of the module 10 permitting the module 10 to be easily received in the bay 20. More specifically, the bay 20 is the part for receiving the module 10. Accordingly, a predetermined space is formed in the inside of the bay 20, and several elements for use in the module are provided near this space.

First, a bay connector 25 corresponding to the module connector 14 for communication between the module and a computer main machine is provided. A drawing part 26 formed on a lateral side adjacent to the bay connecter 25 for drawing the module 10 that has been inserted in the bay 20 out of the bay 20 is also provided. Here, the drawing part 26 has an elastic device such as a spring in its interior that is pushed upon reception of the module while drawing out the module if an external force is removed. Since the drawing operation or force of the drawing part 26 is always applied, it is necessary to suppress the drawing operation while the module is in use. Such role is played by the hooking part 22 positioned on the lateral side of the bay 20.

The hooking part 22 has a tapered portion in a first side closest to the entry side of the bay and has a rectangular portion in the opposite side engaging with the module hooking part 13. The hooking part 22 does not prohibit operation upon module reception but suppresses operation upon drawing of the module, so that the module is not drawn out as far if the locking state of the hooking part 22 is not released. Therefore, the hooking part 22 should be always projected toward the inside of the bay as long as an external force is not applied, which is achieved by the spring 24 installed on one side of the hooking part 22.

In order to draw the received module out of the bay, the hooking part 22 hooked at the module hooking part 13 should be released, which is performed by a button 23 positioned on the lower portion of the bay. A button hole to which the button 23 is joined is formed on a body extending in the rear side of the hooking part 22, and the central part of the hooking part 22 is joined to the bay body 21 and serves as a reference point in the operation described hereinafter. The bay body 21 has a space for receiving the module 10; a drawing part 26 in one lateral portion, the hooking part 22 in the other portion, and a hooking hole 27 for the hooking part 22.

The operation of drawing out and the reception of the FD drive will be described in greater detail hereinafter. In case of receiving the FD drive in the bay 20, the FD drive module is received in the bay by overcoming the elastic force of the spring of the drawing part 26 mounted in the bay 20. The FD drive is then locked by the hooking part 22 and used without being pushed away to the outside. In the case of removing the FD drive, the button 23 positioned on the lower portion of the bay body 21 is pushed so that the hooking part 22 is rotated with respect to the hinge point, and the hooking status between the hooking part 22 and the module hooking part 13 is released. If the module 10 is released from the bay 20, the module 10 is drawn out by the elastic force of the compressed spring of the drawing part 26.

In the foregoing method, upon reception of the module, sufficient pressure for overcoming the elastic force of the drawing part 26 should be applied, and upon removal of the module, abrupt drawing is performed by elastic force of the drawing part 26, so that destruction of the module may be caused in a case where the external peripheral devices are vulnerable to impulses adopted for the module. In order to prevent the above-mentioned problem, a button for unlocking and a button for pushing the module out could be provided, respectively, but there would likely be difficulty in operating the buttons.

Japanese Patent No. 5-189086 describes another apparatus for receiving a module for use in a computer of the background art. However, this type of apparatus suffers from the same operational and technical difficulties described hereinabove. Further, the apparatus of the Japanese Patent includes a complicated mechanical construction, and it is therefore difficult for a user to operate the apparatus.

SUMMARY OF THE INVENTION

The present invention overcomes the shortcomings associated with the background art and achieves other advantages not realized by the background art.

An object of the present invention to provide an apparatus for receiving a module for use in a computer capable of removal of the module through one single operation by permitting the module to be directly drawn out by the external force applied by the user.

These and other objects are accomplished by an apparatus for receiving a module in a computer comprising a housing for receiving a module; a lever being formed on a first side of the housing, the lever providing a straight-line reciprocating motion in response to an external force applied by a user; a pushing arm, the pushing arm having a joining arm part joining with the lever at a first end of the pushing arm, a pressure applying part at a second end thereof for pushing the module, and a central pivot point, wherein the pushing arm is operative about the central pivot point to support a motion between the pressure applying part and the joining arm part; a locking portion having a driving part cooperatively facing the lever, the driving part including a reference pivot point for rotation of the driving part about the reference pivot point; and a hooking part cooperatively engaging with the driving part, wherein the hooking part includes a protuberance for operatively fixing the module within the housing.

These and other objects are accomplished by an apparatus for receiving a module for a computer comprising a housing for receiving a module; a pushing arm having an elongated hole for receiving a protuberance projecting from the housing, the pushing arm being capable of a reciprocating straight-line motion along the elongated hole and guided by the protuberance; a cooperating lever arm being formed in an L-shape, the cooperating lever arm having a first end being joined with the pushing arm at a position adjacent to the elongated hole of the pushing arm and an other end forming an operating point at which an external force may be applied; and a lever capable of being rotated with respect to an operating point guide and a central pivot point, the operating point of the other end of the cooperating lever arm being inserted into the operating point guide and permitting rotation of the lever with respect to the central pivot point and the operating point guide.

These and other objects are accomplished by an apparatus for receiving a module in a computer comprising a housing for receiving a module; a lever, the lever including a separating lever formed on a first side of the housing and to which external force is applied by a user, and a semicircular cam having a semicircular shape and extending from the separating lever; a locking piece having a locking cam projecting from a first side and capable of contacting the module and affixing the module in a locked position, the locking piece having a inclined cam for receiving the external force; a cooperating lever arm being formed in an elongated shape, the lever arm having a first cam portion for receiving external force by contacting the semicircular cam and a second cam portion for delivering the external force to the locking cam; and a pushing arm for receiving the external force from the semicircular cam and for providing a releasing force capable of pushing and separating the module to release the locking cam from engaging the module in the locked position.

These and other objects are accomplished by an apparatus for receiving a module in a computer comprising a housing for receiving a module; a lever being formed on a first side of the housing and to which an external force is applied by a user; means for pushing the module out of the housing using only the external force applied to the lever; and a locking piece for fixing a position of the module in a locked position within the housing.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF PREFERRED EMBODIMENTS

Figure 1:
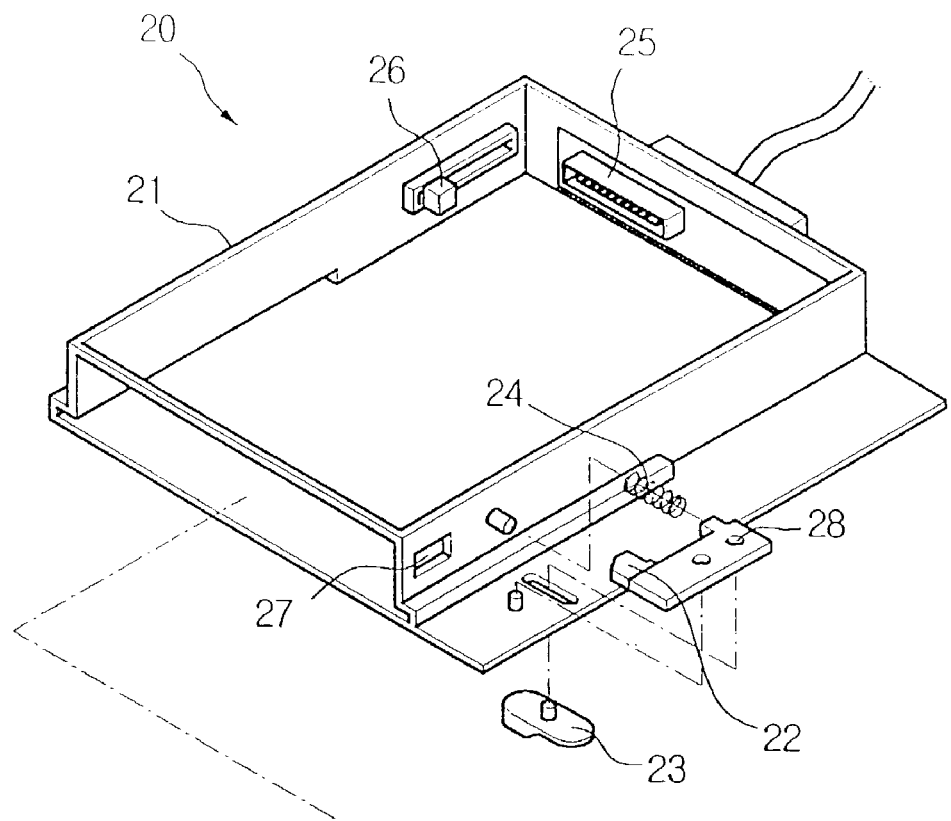
FIG. 1 is an exploded, perspective view of an apparatus for receiving a module for use in a computer according to the background art.
Figure 1:
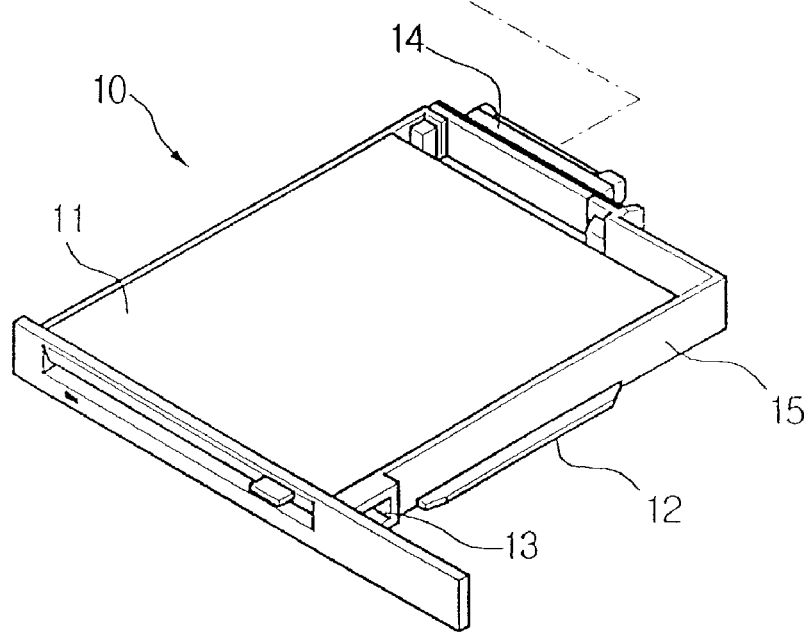

A preferred embodiment of the present invention will now be described with reference to the accompanying drawings.

In the following description, the same drawing reference numerals are used for the same elements throughout the accompanying drawings.

Figure 2:
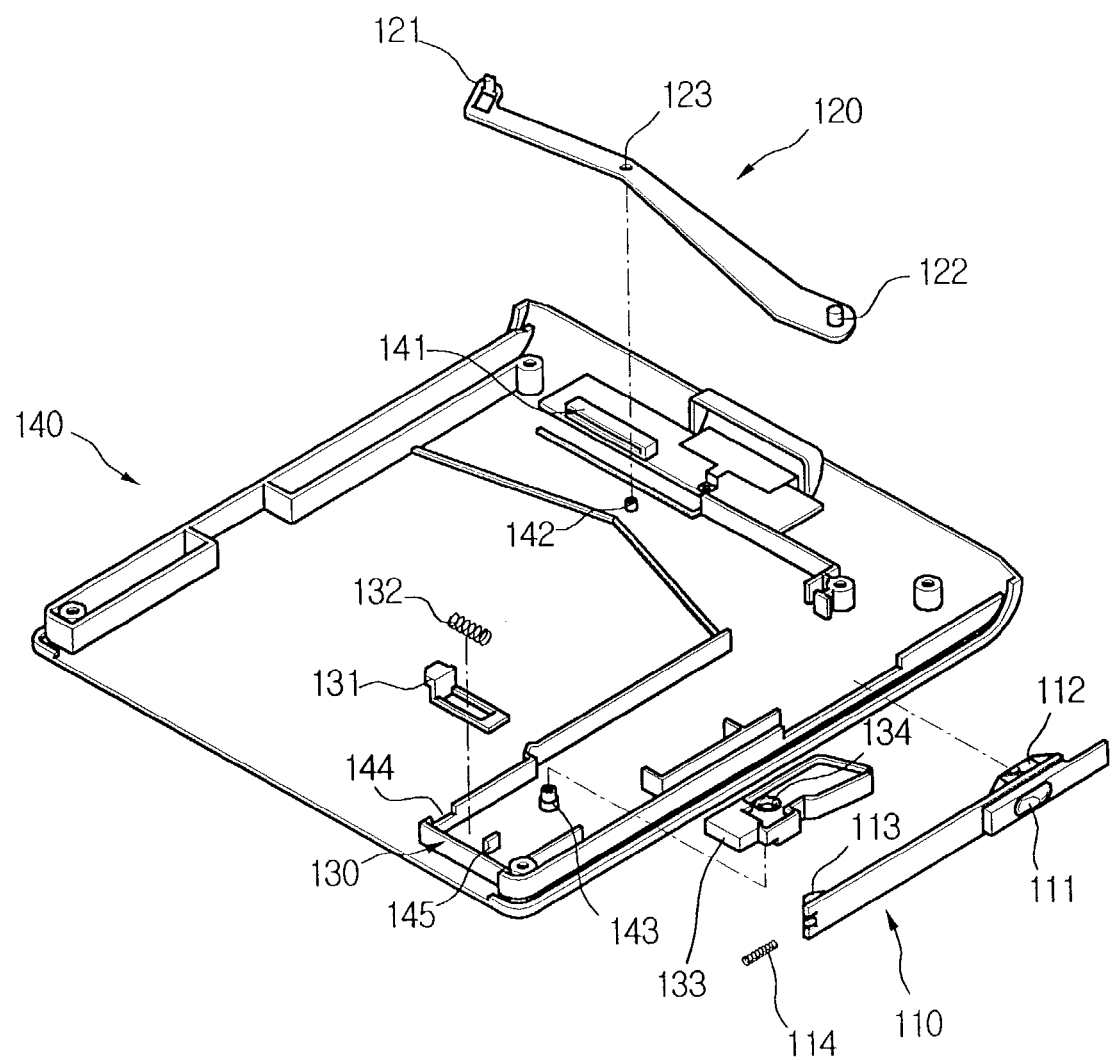
FIG. 2 is an exploded, perspective view of an apparatus for receiving a module for use in a computer according to the first embodiment of the present invention.
Figure 3:
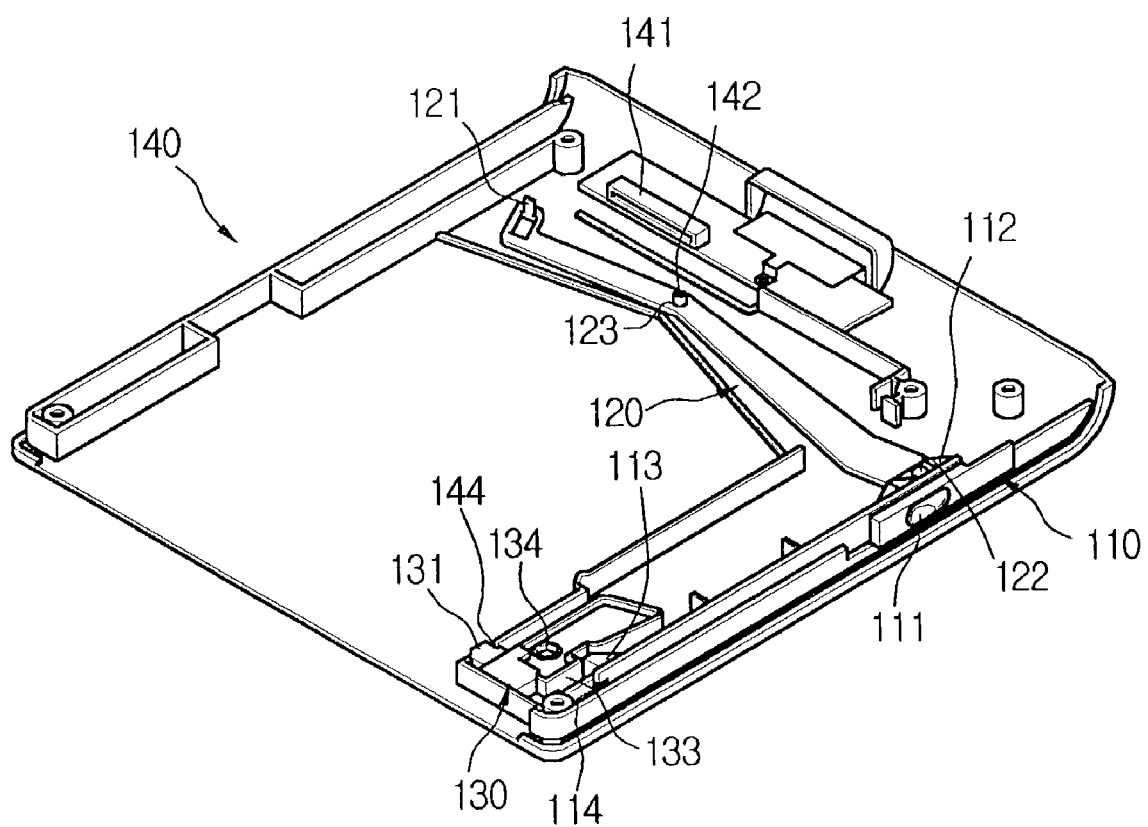
FIG. 3 is a perspective view an apparatus in an assembled state for receiving a module for use in a computer according to the first embodiment of the present invention.
Figure 4:
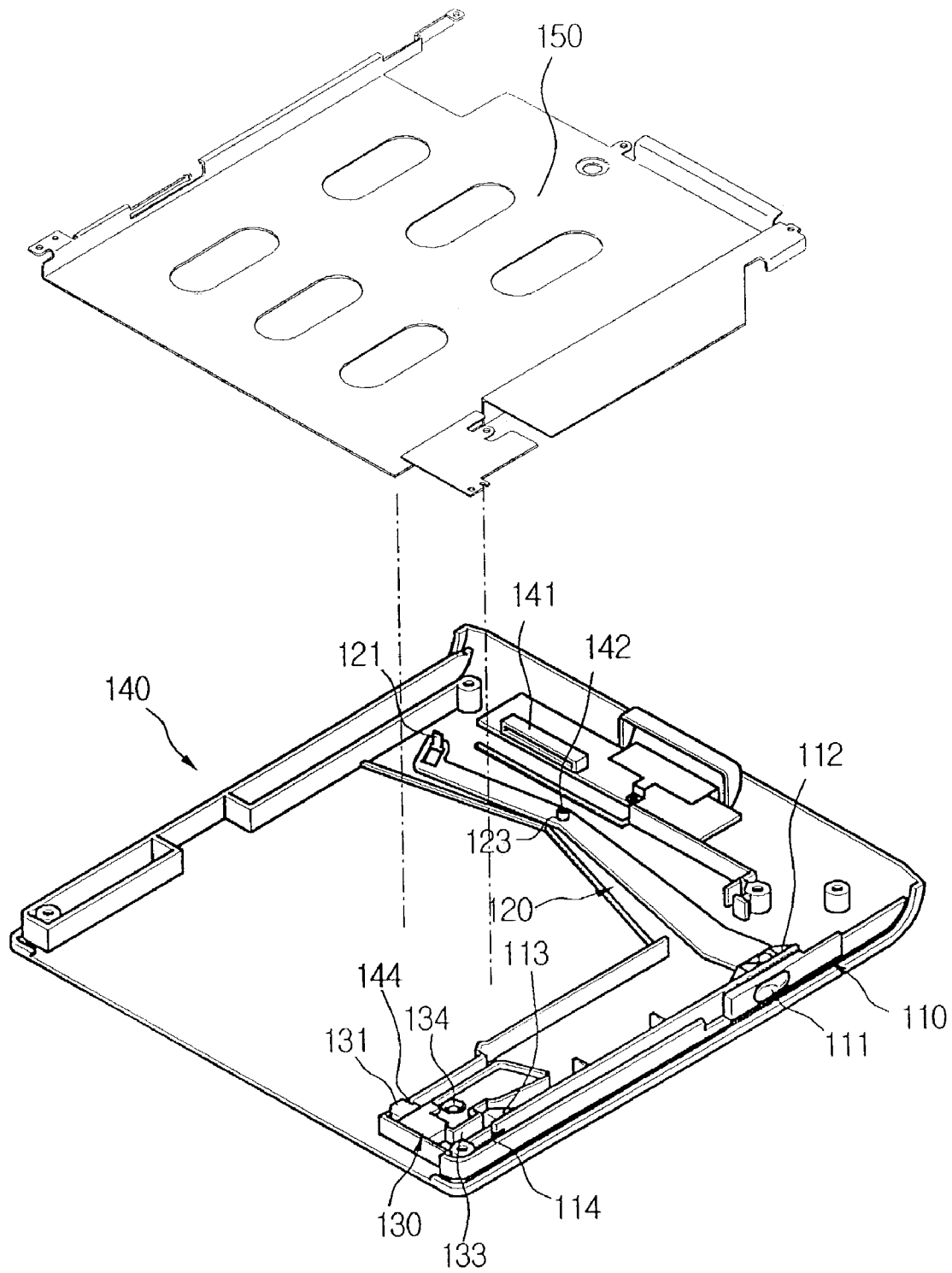
FIG. 4 is a exploded, perspective view showing a rear side shield being joined with the apparatus according to the first embodiment of the present invention.
Figure 5:
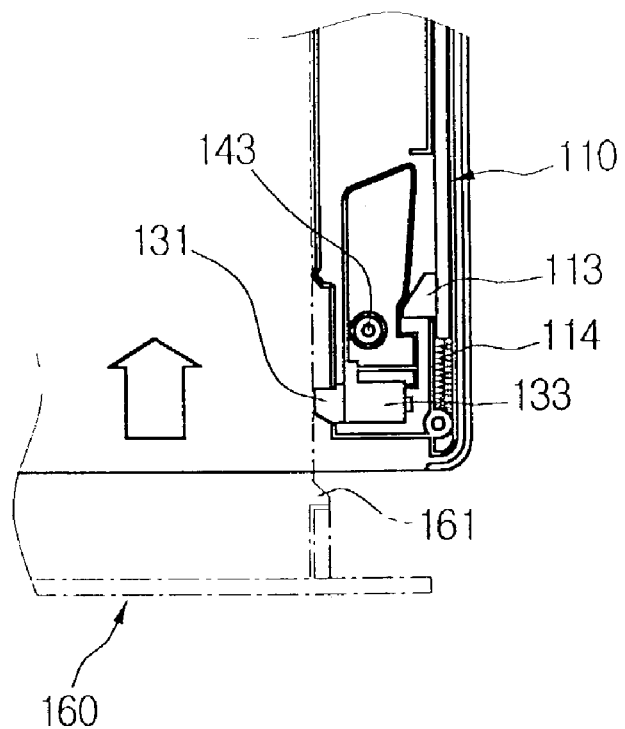
FIG. 5 is a partial sectional view showing an operation of inserting the module according to the first n embodiment of the present invention.
Figure 6:
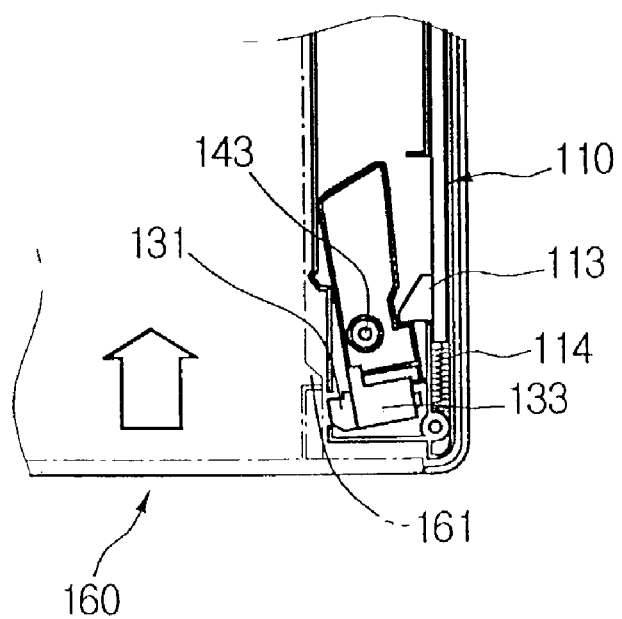
FIG. 6 is a partial sectional view showing an operation of inserting the module according to the first embodiment of the present invention.
Figure 7:
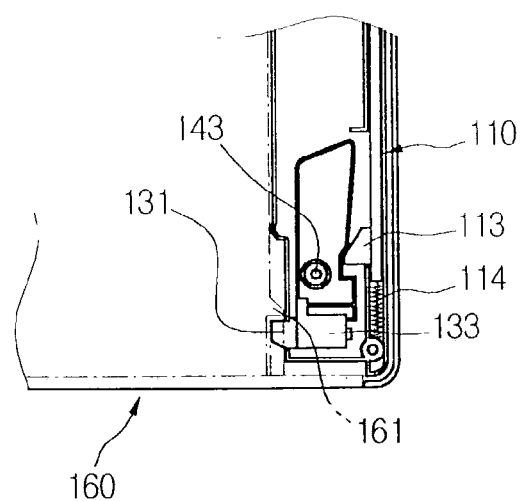
FIG. 7 is a partial sectional view showing an operation of inserting the module according to the first embodiment of the present invention.
Figure 8:
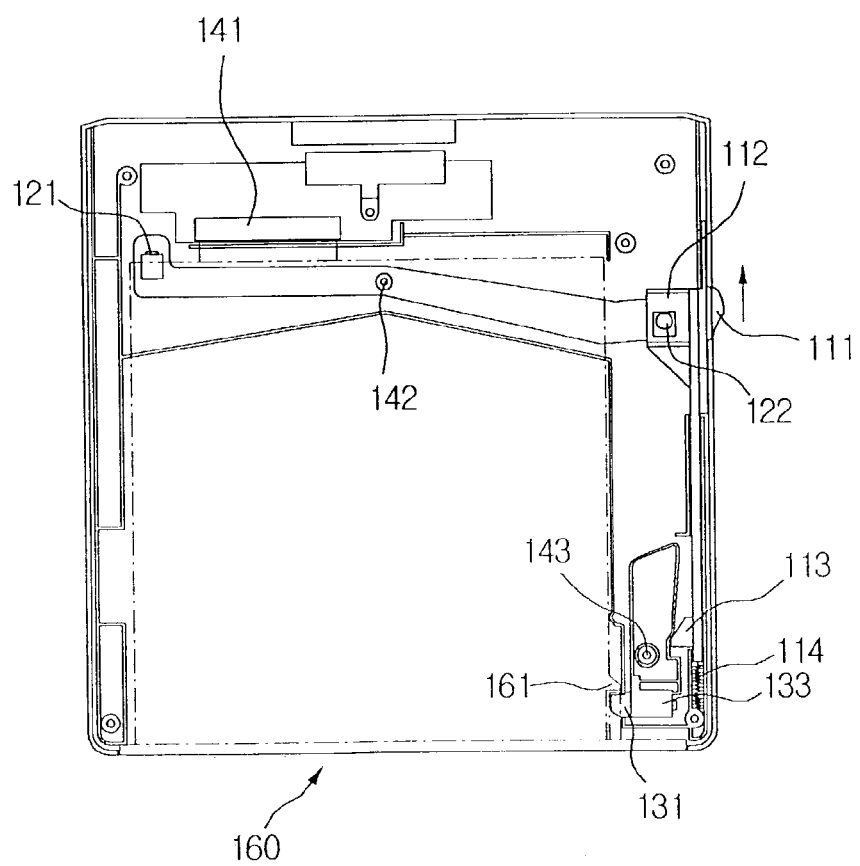
FIG. 8 is a sectional view showing an operation of removing the module according to the first embodiment of the present invention.
Figure 9:
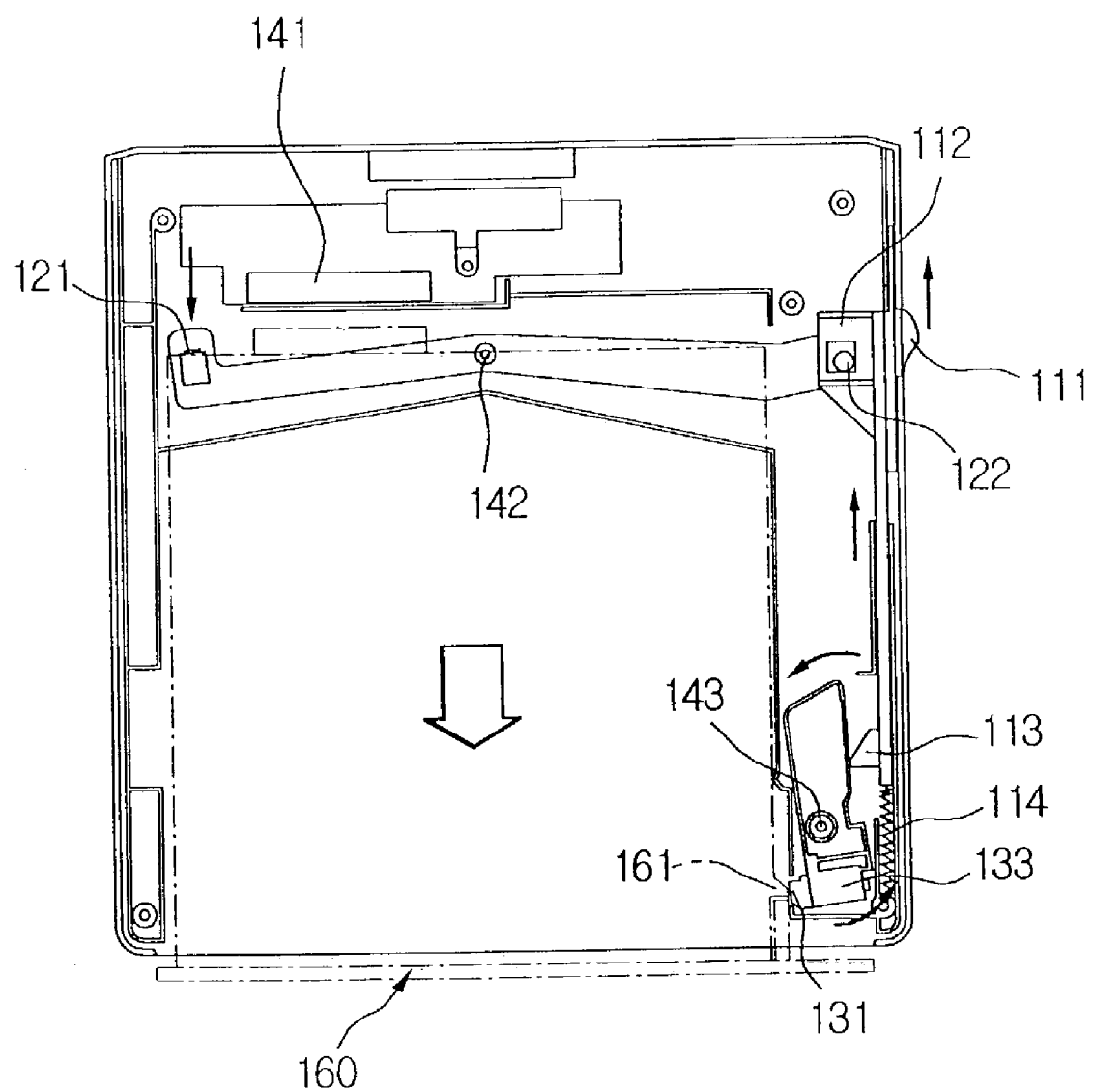
FIG. 9 is a sectional view showing an operation of removing the module according to the first embodiment of the present invention.
Figure 10:
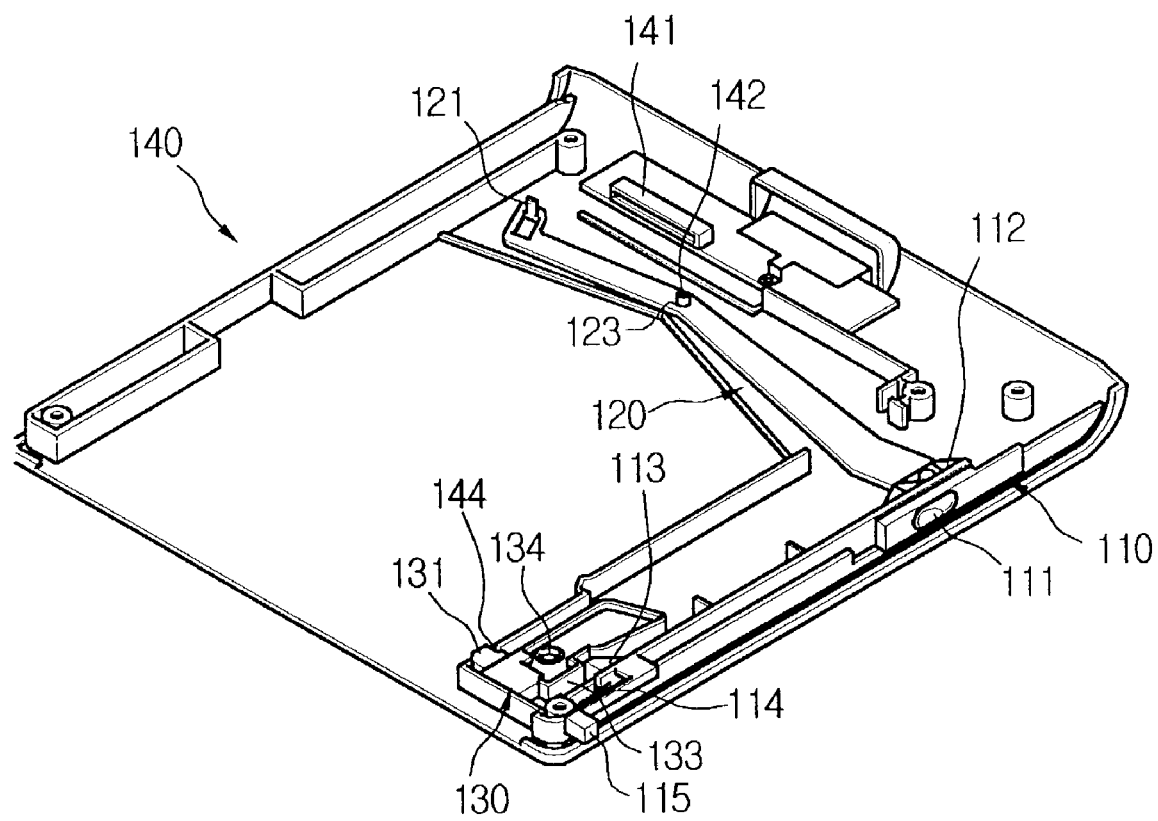
FIG. 10 is a perspective view showing the module according to the first embodiment of the present invention.

FIG. 1 is an exploded, perspective view of an apparatus for receiving a module for use in a computer according to the background art. FIG. 2 is an exploded, perspective view of an apparatus for receiving a module for use in a computer according to the first embodiment of the present invention. FIG. 3 is a perspective view an apparatus in an assembled state for receiving a module for use in a computer according to the first embodiment of the present invention. FIG. 4 is a exploded, perspective view showing a rear side shield being joined with the apparatus according to the first embodiment of the present invention. FIG. 5 is a partial sectional view showing an operation of inserting the module according to the first n embodiment of the present invention. FIG. 6 is a partial sectional view showing an operation of inserting the module according to the first embodiment of the present invention. FIG. 7 is a partial sectional view showing an operation of inserting the module according to the first embodiment of the present invention. FIG. 8 is a sectional view showing an operation of removing the module according to the first embodiment of the present invention. FIG. 9 is a sectional view showing an operation of removing the module according to the first embodiment of the present invention. FIG. 10 is a perspective view showing the module according to an embodiment of the present invention.

First Embodiment

FIG. 2 is an exploded, perspective view of an apparatus for receiving a module for use in a computer according to the first embodiment of the present invention. Referring to FIG. 2, the apparatus for receiving a module for use in a computer according to the present embodiment has a lever portion 110 formed on lateral side of a housing 140, for performing a reciprocating straight-line motion by operation of a user.

Also, a lever connecting part 122 whose first end is joined to the lever 110 in a hinge manner, a pressure applying part 121 formed on the other end of the lever connecting part 122 for pushing against the module received, and a pushing arm 120 having a reference point 123 formed as a central point for rotation being positioned between both ends of the lever connecting part 122 are provided. The pressure applying part 121 performs a reciprocating rotational motion within a predetermined range by the reciprocating straight-line action of the lever 110.

A hooking part 131 for preventing the received module from being detached by hooking the received module, and a hooking part driving part 133 whose first side is connected with the lever 110 and whose other side is connected with the hooking part 131 are provide for operating the hooking part 131 by the operation of a user. A locking piece 130 is also provided, on which a reference point 134 is formed for being fixed on the housing 140 as a central point of rotational motion of the hooking part driving part 133 and for getting the hooking part 131 to perform a reciprocating motion within a predetermined range by the reciprocating straight-line motion of the lever 110.

More specifically, the lever 110 includes a button 111 being operated by and receiving external force applied by a user, a pushing arm driving part 112 having at least a predetermined groove or hole and being joined in a hinged manner to the lever connecting part 122, and a locking piece driving part 113 at least whose one side is plane-contacted with the locking piece 130 for operating the locking status of the locking piece 130. The lever 110 also includes an elastic member 114 maintaining the position of the lever 110 at a predetermined position.

The pushing arm driving part 112 has a predetermined groove or hole joined by a hinge to the lever connecting part 122, e.g., exemplified as a protuberance, which is one end of the pushing arm 120. Also, the locking piece driving part 113 is a protuberance having one side inclined for performing a straight-line motion when contacted with the locking piece 130.

Also, the pushing arm 120 includes the lever connecting part 122 having a protuberance being joined to the pushing arm driving part 112 of the lever 110. The pushing arm 120 also includes the pressure applying part 121 formed on the other end opposite to the lever connecting part 122. The reference point 123 is a reference point for the drawing operation of the module between the lever connecting part and the pressure applying part. For example, it is preferable that the reference point 123 is formed with a hole, and is fitted or joined to a protuberance formed on the housing 140.

The locking piece 130 includes the hooking part 131 for preventing unwanted detachment of the received module, the hooking part driving part 133 for releasing the hooking part 131 by operation of a user, and an elastic member 132 for maintaining a normal operating position of the hooking part 131. The hooking part 131 and the hooking part driving part 133 are provided separately and a spring 132 is additionally installed in the hooking part 131. If external force is not applied, the hooking part 131 is projected toward the module receiving space. One end of the elastic member 132 is supported by the hooking part 131 and the other end of the elastic member 132 is contacted with a hooking protuberance 145, so that the elastic member 132 generates the pushing force.

It is also possible to integrally form the hooking part 131 and the hooking part driving part 133 in one body, and arrange the elastic member in another appropriate position. The lever 110, the pushing arm 120, and the locking piece 130 described in the foregoing are all installed in the housing 140 in which the module receiving space is formed.

The housing 140 further includes a locking hole 144 formed on the inner lateral side of the housing 140 through which the hooking part 131 enters and exits, a reference protuberance 143 being inserted into a reference point 134 which is a reference for operation of the locking piece 130, a reference protuberance 142 on which the pushing arm 120 is mounted, and a reception connector 141 being connected with a connector of the received module.

FIG. 3 is a perspective view of the apparatus for receiving the module for use in a computer. Referring to FIG. 3, the pushing arm 120 and the locking piece 130 in the lever 110 are cooperatively engaged with each other to operate and move together. The lever connecting part 122 is joined, e.g., with a hinged connection, to the pushing arm driving part 112, and the locking piece driving part 113 is contacted with one side of the hooking part driving part 133. If the lever 110 moves up and down, rotational motion of the pushing arm 120 is generated by the pushing arm driving part 112, while rotational motion of the hooking part driving part 133 is generated by the locking piece driving part 113.

As shown in FIG. 4, a rear side shield 150 is additionally provided in a preferred embodiment for firmly joining the pushing arm 120 and the locking piece 130 to the housing 140 by covering the pushing arm 120, the locking piece 130, and the whole lower side within the housing 140, and for facilitating easy attachment and detachment of the module. Also, the elastic member 114 is provided on the end of the lever 110. Therefore, if the external force applied by a user is removed, the lever may be restored to a basic position that has no influence on the pushing arm 120 and the locking piece 130.

Operation of the apparatus having the foregoing construction according to the first embodiment of the present invention will be described hereinafter with reference to FIG. 5 and FIG. 6. FIG. 5 through FIG. 6 sequentially show the module being placed into apparatus. When a user inserts the module 160, the lever 110 and the pushing arm 120 do not move. However, the hooking part 131 is rotated inward and is moved by being hooked at the module hooking part 161 provided on the inserted module 160 (refer to FIG. 6). Also, the hooking part 131 is restored to the original position by the tensile force of the elastic member (refer to the element 132 in FIG. 2) after the module hooking part 161 passes by the hooking part 131 (refer to FIG. 7).

Therefore, there is no movement in the lever and the pushing arm during the reception process of the module 160, and the module 160 is smoothly inserted and fixed in its position due to the interacting motion of each surface of the inclined protuberances respectively formed on the module hooking part 161 and the hooking part 131.

FIG. 8 and FIG. 9 show the module during the process of removing the module from the apparatus. FIG. 8 shows a state of the apparatus right before or after the module is removed. The direction along which external force is applied to the button 111 by a user, is shown by an arrow, and a series of operations are performed by such action.

Referring to FIG. 9, if a user pushes the button 111 in the direction of the arrow, the lever 110 is moved, and the pushing arm 120 and the locking piece 130 are operated accordingly by a series of connecting structures. More specifically, the pushing arm 120 is joined to the pushing arm driving part 112 joined in a hinged manner to the lever connecting part 122, and is not operated immediately due to a margin of a wide hole or groove upon movement of the lever 110. The pushing arm 120 is not operated before the lever 110 is moved more than a predetermined distance, e.g., but is operated only after a predetermined interval.

A predetermined margin may also be secured by an interval between the pressure applying part 121 and the module 160. In contrast, the locking piece driving part 113 immediately reacts upon movement of the lever 110 since it is directly plane-contacted with the hooking part driving part 133. Therefore, if a user pushes the button 111, the locking piece 130 is first operated for releasing the hooking part 131 that has locked the received module, and after that the pushing arm 120 is operated. Then, the pressure applying part 121 pushes the module 160, whereby the module 160 could be safely removed.

It is preferable that the reference point of the locking piece 130 and the reference point of the pushing arm 120 are positioned close to sides of the hooking part 131 and the pressure applying part 121 rather than the side of the lever 110 so that they could be moved by a relatively smaller force using a lever principle.

FIG. 10 is a perspective view showing the module according to an embodiment of the present invention. Referring to FIG. 10, it is seen that a push button 115 is formed on the front side of the lever 110. The push button 115 is positioned in the front, for performing the same operation as the button 111 on the lateral side and therefore permits the module to be removed more conveniently by a user. The apparatus for receiving the module for use in a computer having the foregoing construction according to the present invention eliminates problems associated with the structures of the background art. When the module was removed from the apparatus of the background art under a relatively large spring force, the module was often damaged or destroyed due to external impulse of the spring(s). In addition, a simple and easy way to store and operate the module with the apparatus of the first embodiment of the present invention is provided.

Second Embodiment

Figure 11:
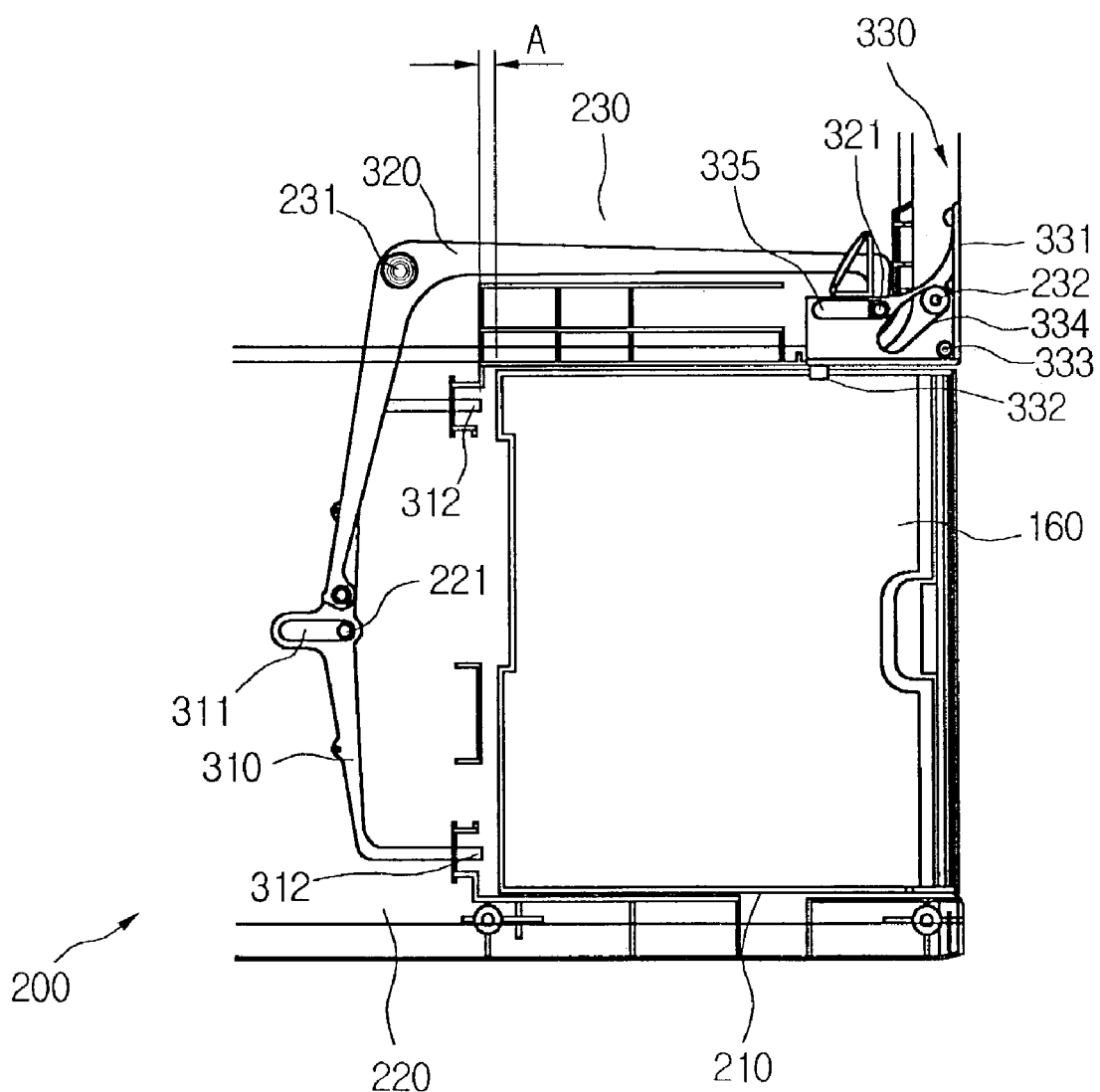
FIG. 11 is a partial sectional view showing the operation of the module according to the second embodiment of the present invention.
Figure 12:
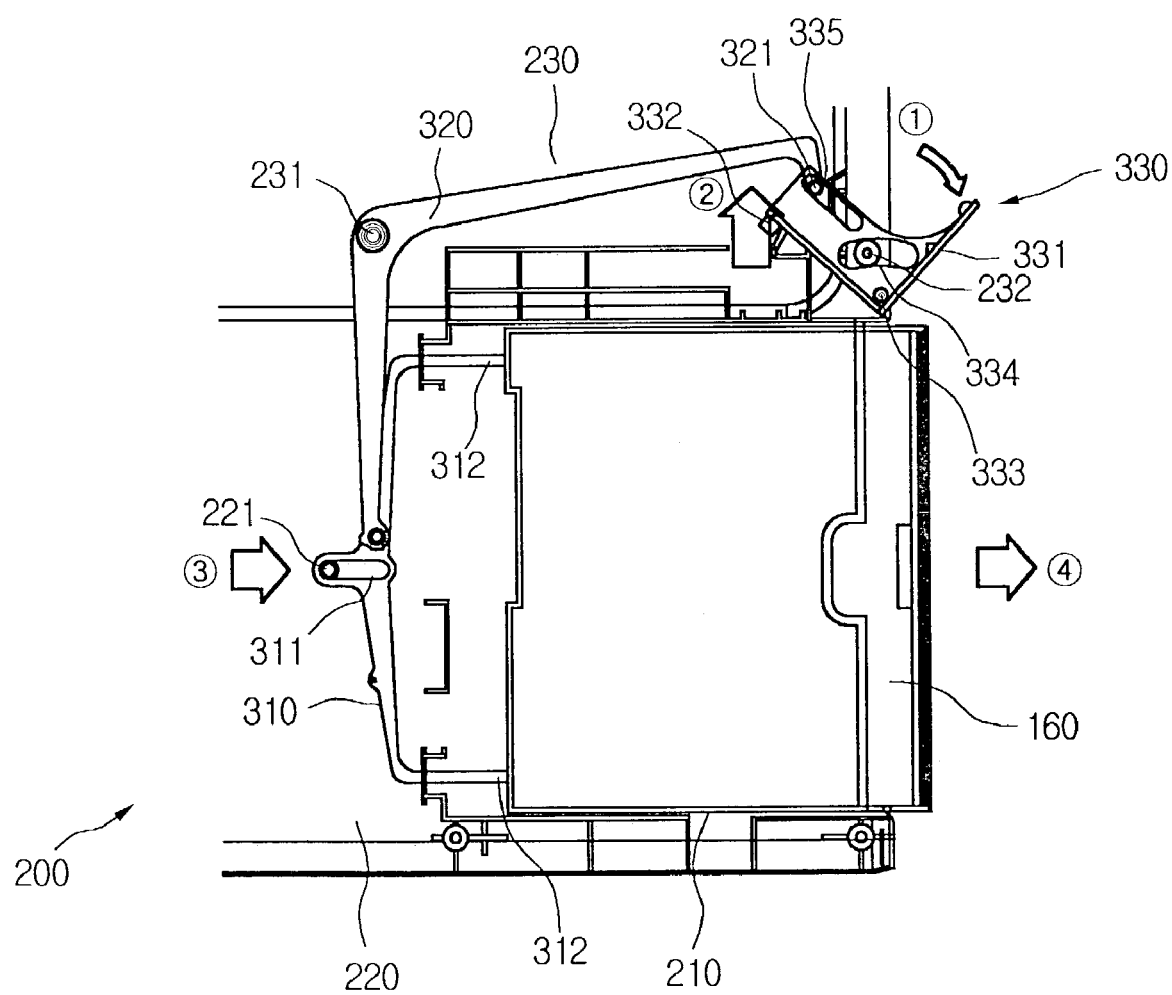
FIG. 12 is a partial sectional view showing the operation of the module according to the second embodiment of the present invention.

FIG. 11 is a partial sectional view showing the operation of the module according to the second embodiment of the present invention. FIG. 12 is a partial sectional view showing the operation of the module according to the second embodiment of the present invention. Referring to FIG. 11, the apparatus for receiving the module for use in a computer includes a housing 200 for receiving the module, a pushing arm 310 for facilitating the module to be drawn out by pushing against the module received in the housing 200, a cooperating lever arm 320 for operating the pushing arm 310 and a lever 330 for operating the cooperating lever arm 320 using external force.

More specifically, the housing 200 includes a receiving part 210 having a receiving space for receiving the module 160, a rear part positioned in the rear side of the receiving part 210 and having a predetermined space, lateral sides 230 constituting both lateral sides of the receiving space. The pushing arm 310 also includes a elongated hole 311 positioned in the rear part 220 of the inner side of the housing 200 for receiving a protuberance 221 projected from the housing and operating terminals 312 formed at both ends for pushing the module by coming into contact with the module 160. Particularly, the operating terminals 312 form a predetermined interval A in the state that the module 160 is inserted in the housing, so that stable insertion and removal of the module 160 is secured.

The cooperating lever arm 320 is bent in a L-shape and one end of the cooperating lever arm 320 is joined, e.g., in a hinged manner, to the pushing arm 310 in the vicinity of the elongated hole 311. The other end of the cooperating lever arm 320 is connected to the lever 330 by an operating point 321 having a projecting shape. The position where the cooperating lever arm 320 is bent is rotatable around a protuberance 231 fixed on the housing 200.

The lever 330 includes an operating point guide 335 formed in a groove or a hole of a long shape for receiving the operating point 321, a lever central point 333 which is a central axis for rotation of the lever 330, a protuberance 232 extended from the housing for stably rotating the lever 330, and a protuberance guide 334 having a smooth curved shape for receiving the protuberance 232. Various operating methods for the lever 330 may be adopted as long as the cooperating lever arm 320 is rotated by the operation of the user. The relationship between each of the foregoing elements will be described in the following.

A connector (not shown) corresponding to the module connector arranged in the rear side of the module is additionally provided. The cooperating lever arm 320 for mechanically transferring the rotational operation of the lever 330 by a user to the pushing arm 310 is positioned in the lateral part 230. The cooperating lever arm 320 is configured such that the side facing the pushing arm 310 with respect to the protuberance 231 is shorter than the side facing the lever 330. This permits the module 160 received in the receiving part 210 to be possibly removed with use of a relatively small force, e.g., applying the lever principle. Also, the cooperating lever arm 320 is joined to the protuberance 231 formed on the lateral part 230 of the housing and is rotatable so that the whole cooperating lever arm 320 performs a reciprocating, rotational motion within a predetermined range around the protuberance 231 which is the center of a rotational axis by the lever 330.

The lever 330 is formed in a L-shape and additionally includes a locking piece 332 formed on one side of the lever 330 for preventing the module 160 from being detached by permitting the module 160 to be hooked. A pulling part 331 formed on the other side of the lever 330, and to which external force of a user is applied.

Operation of a multi-use bay for use in a computer having the foregoing construction will be described in greater detail hereinafter. FIG. 11 shows a status before the module is drawn out and FIG. 12 shows a status after the module is drawn out. If the pulling part 331 is pulled back by a user, the locking piece 332 that has fixed the received module 160 is detached and released, and the locking piece 332 simultaneously pushes the operating point 321 of the cooperating lever arm 320 connected with the pulling part 331 to the outer, lateral side of the housing.

The lever 330 is also rotated around the lever central point 333 and the protuberance guide 334 is guided by the protuberance 232, whereby the rotational trajectory of the lever 330 can be stabilized. The position of the operating point 321 of the cooperating lever arm 320 can be stably supported by the operating point guide 335.

If the operating point 321 is moved, the cooperating lever arm 320 is rotated around the protuberance 231, pushing the pushing arm 310 joined in a hinged manner to the other end of the cooperating lever arm 320. The pushing arm is guided by the elongated hole 221 formed at its center, and is moved to the front in a straight-line direction. Operating terminals 312 bent and formed on both ends of the pushing arm 310 push the module 160 in a direction outward from the receiving space, whereby the module 160 is removed from the computer.

When the module 160 is inserted, the operating terminals 312 and the end of the module 160 are separated apart by a predetermined interval A, so that the module 160 is drawn out from the rear side after the hooking part 332 is first detached if the pulling part 331 is pulled back. This transfer of force can be more clearly understood by viewing the arrows marked in the order by ①,②,③,④ in FIG. 12. According to the second embodiment, the module can be inserted and removed to and from the computer in a more safe and stable manner.

Third Embodiment

Figure 13:
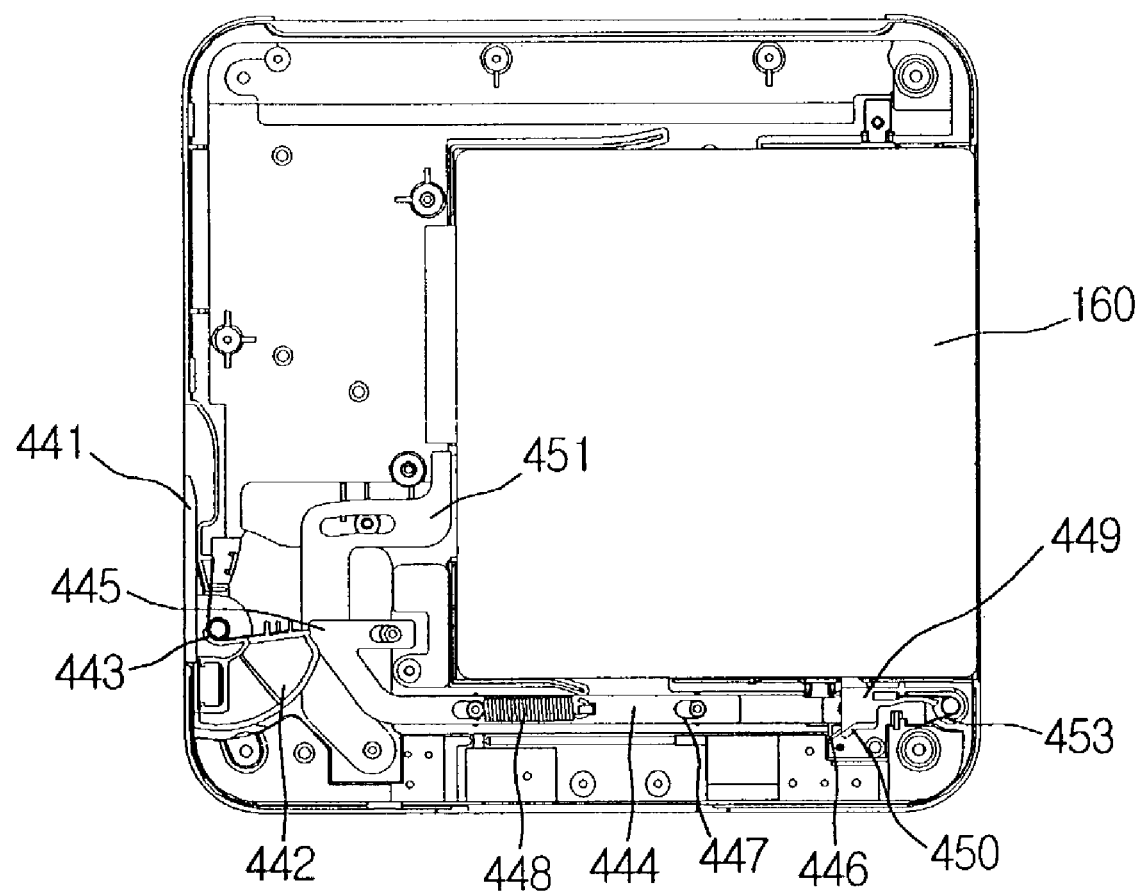
FIG. 13 is a plan view of an apparatus for receiving a module for use in a computer according to a third embodiment of the present invention.
Figure 14:
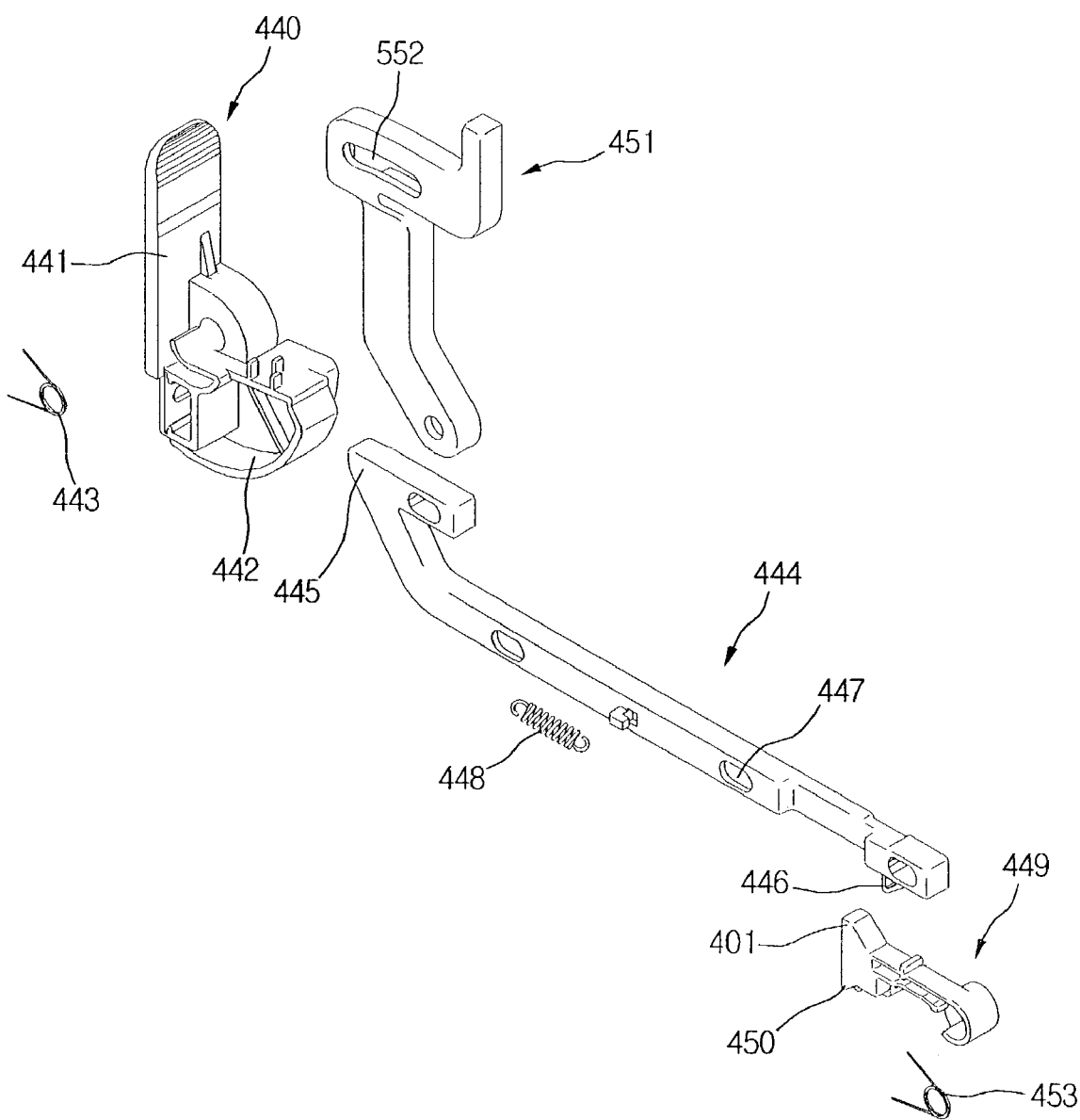
FIG. 14 is a exploded, perspective view of a portion of an apparatus for receiving a module for use in a computer according to the third embodiment of the present invention.
Figure 15:
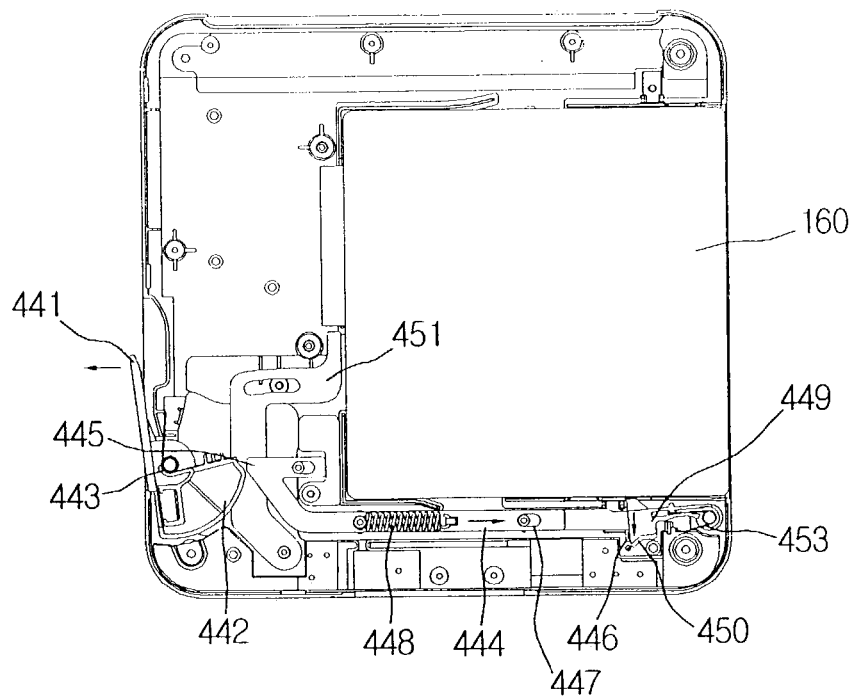
FIG. 15 is a plan view showing a state where the module is released from an affixed state according to the third embodiment of the present invention.
Figure 16:
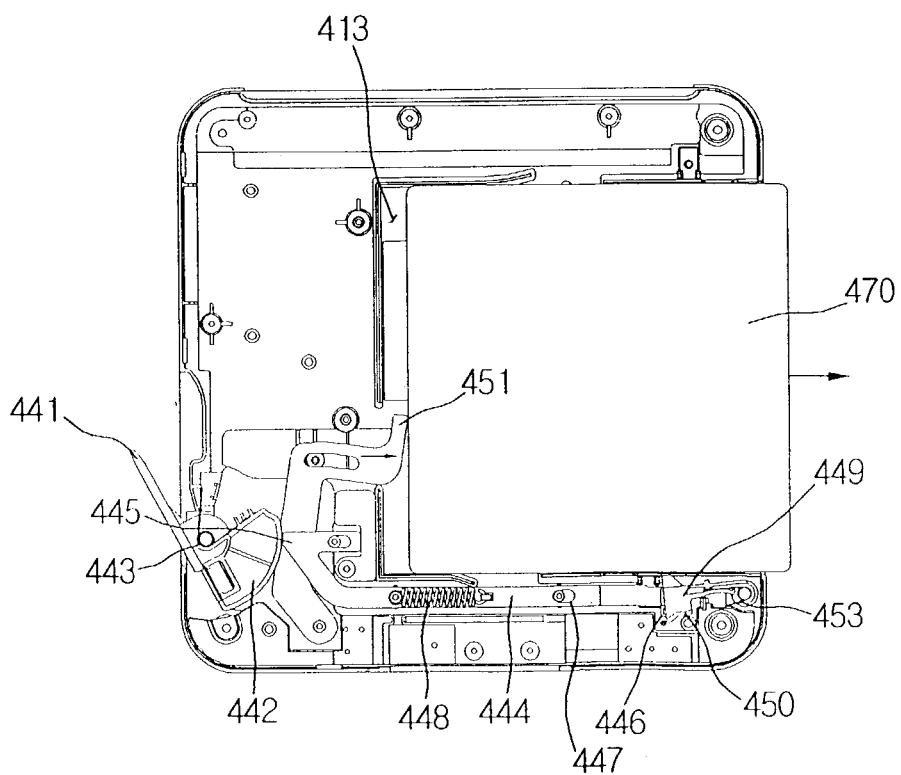
FIG. 16 is a plan view showing an operation where the module is removed according to the third embodiment of the present invention.

FIG. 13 through FIG. 16 show a third embodiment of the present invention. FIG. 13 is a plan view of an apparatus for receiving a module for use in a computer according to a third embodiment of the present invention. FIG. 14 is a exploded, perspective view of a portion of an apparatus for receiving a module for use in a computer according to the third embodiment of the present invention. FIG. 15 is a plan view showing a state where the module is released from an affixed state according to the third embodiment of the present invention. FIG. 16 is a plan view showing an operation where the module is removed according to the third embodiment of the present invention.

Referring to FIG. 13 and FIG. 14, a lever 440 to which external force for drawing the module is applied, a cooperating lever arm 444 formed in a bar shape of a predetermined length for receiving external force from the lever 440, a pushing arm 451 transferring external force from the lever 440 and permitting the module to be removed by pushing the inserted module outward, and a locking piece 449 for fixing the inserted module 160 are provided as shown.

More specifically, the lever 440 includes a separating lever 441 for receiving external force from a user, a semicircular part 442 having a semicircular shape integrally joined to the separating lever 441 for delivering an external force to the cooperating lever arm 444 and the pushing arm 451, and the first spring 443 for positioning the semicircular part 442. Also, the cooperating lever arm 444 includes the first cam part 445 formed on one end of the cooperating lever arm 444 and plane-contacted with the semicircular part 442 and inclined along a predetermined angle so that the cooperating lever arm 444 may be moved in the direction of separating a device for extension use using torque of the semicircular part 442. The cooperating lever arm 444 includes the second cam part 446 formed on the other end of the cooperating lever arm 444 and inclined at a predetermined angle for releasing the locked state of the module 160 through cam operation, more than one insertion hole 447 for guiding the motion of the cooperating lever arm 444 through a predetermined protuberance, and the second spring 448 for positioning the cooperating lever arm 444 when external force is removed.

The insertion hole 447 is formed in an elongated hole shape of a predetermined length for performing a straight-line motion toward the locking piece 449 through cam operation between the semicircular part 442 in the lower end of the lever 441 and the first cam part 445 upon predetermined angular rotation of the separating lever 441. The locking piece 449 includes an inclined cam 450 formed corresponding to the second cam part 446 for generating rotational motion of the locking piece 449, a fixing cam 461 formed on one side of the inclined cam 450 being used for fixing the module 160, and the third spring 453 for positioning the locking piece 449 normally positioned when external force is removed. The pushing arm 451 comes into plane-contact with the lower end of the semicircular part 442 for being rotated, and the end of the pushing arm 451 pushes the module 160. Also, a guiding part 552 for guiding rotational motion of the pushing arm 451 is provided.

Operations of each of the foregoing parts will be described in greater detail hereinafter. The locking piece 449 releases a fastening force of the fixing cam 461 that has fixed the module 160 through cam operation with the second cam part 446 formed on one side of the cooperating lever arm 444. The second cam part 446 makes the fixing member 449 rotate by coming into contact with the inclined cam 450 so that the cooperating lever arm 444 is pushed outward.

The pushing arm 451 is mounted on the upper end of the lever 440, and is rotated a predetermined angle by contact with a peripheral surface of the lower end of the semicircular part 442 upon rotation of the separating lever 441 beyond a predetermined limit. Due to rotation of the pushing arm 451, the end of the pushing arm 451 pushes the module 160 and the module 160 is drawn out and removed.

Also, the insertion hole 552 is formed in a curved surface having a predetermined curvature, for exactly guiding the pushing arm 451, and a fixed protuberance is provided in the inside of the insertion hole 552. FIG. 15 and FIG. 16 are drawings illustrating the operation of the third embodiment of the present embodiment. FIG. 15 shows a state where the module is released from a fixed position and FIG. 16 shows a state where a module is detached from the apparatus.

If the separating lever 441 is rotated, the semicircular part 442 integrally formed on the lower part of the separating lever 441 is rotated as much as the predetermined angle, so that the first cam part 445 of the cooperating lever arm 444 contacting with the semicircular part 442 is accordingly moved. Also, due to the movement of the cooperating lever arm 444, the second cam part 446 pushes the inclined cam 450 of the locking piece 449. The locking piece 449 is then rotated by operation of the cam, so that the fixing cam 461 that has fixed the module 160 is detached. The foregoing explanation is shown in FIG. 15.

When the fastening force for the module 160 is removed, if the separating lever 441 is subsequently pulled back further, the semicircular surface formed on the lower side of the semicircular part 442 only moves the pushing arm 451 as much as the predetermined angle, e.g., it is limited by the angle of the semicircular part. The pushing arm 451 then pushes the module 160, and the module 160 is drawn out of the apparatus toward the outside as seen in FIG. 16.

After the module 160 is completely separated by the pushing arm 451 in this manner, force that has been applied to the separating lever 441 is removed. When the external force is removed, the separating lever 441, the cooperating lever arm 444, and the module locking piece 449 are all restored to their original positions, respectively, by elastic forces of the respective springs 443, 448, 453.

According to the present embodiment, undesirable forces acting upon the module are eliminated, and the module can be used in a safer manner. Also, the module can be drawn out and removed in a simple operation. A user gradually applies an external force, not a constant elastic force of a spring that abruptly moves modules in the background art, so that stable separation of the module is achieved during insertion and removal of the module.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An apparatus for receiving a module in a computer comprising:
   a housing for receiving a module;
   a lever being formed on a first side of the housing, said lever providing a straight-line reciprocating motion;
   a pushing arm, said pushing arm having a joining arm part joining with the lever at a first end of said pushing arm, a pressure applying part at a second end thereof for pushing the module, and a central pivot point, wherein said pushing arm is operative about the central pivot point to support a motion between the pressure applying part and the joining arm part;
   a locking portion having a driving part cooperatively facing the lever, said driving part including a reference pivot point for rotation of said driving part about said reference pivot point; and
   a hooking part driving part cooperatively engaging with a hooking part, having a reference point wherein said hooking part includes a protuberance for operatively fixing the module within said housing;
   wherein the hooking part driving part is operative about said reference point to support a motion between a lever portion and the hooking part.

2. The apparatus according to claim 1, wherein the hooking part further comprises an elastic device for spring biasing the hooking part in a normal operating position.

3. The apparatus according to claim 1, wherein the lever further comprises an elastic device for spring biasing the lever in a normal operating position.

4. The apparatus according to claim 1, wherein said hooking part driving part has a predetermined interval between said protuberance.

5. An apparatus for receiving a module for a computer comprising:
   a housing for receiving a module;
   a pushing arm having an elongated hole for receiving a protuberance projecting from the housing, said pushing arm being capable of a reciprocating straight-line motion along the elongated hole and guided by the protuberance;
   a cooperating lever arm being formed in an L-shape, said cooperating lever arm having a first end being joined with said pushing arm at a position adjacent to the elongated hole of the pushing arm and an other end forming an operating point at which an external force may be applied; and
   a lever capable of being rotated with respect to an operating point guide and a central pivot point, said operating point of said other end of said cooperating lever arm being inserted into the operating point guide and permitting rotation of said lever with respect to said central pivot point and said operating point guide.

6. The apparatus according to claim 5, wherein the operating point guide is formed along a direction parallel to a direction in which the module is received within said housing.

7. The apparatus according to claim 5, wherein ends of the pushing arm include a pair of operating terminals capable of contacting a rear side of the module to produce a removal force.

8. The apparatus according to claim 7, wherein a predetermined interval is provided between the operating terminals and a rear side of the module in a locked position.

9. The apparatus according to claim 5, further comprising:
   a protuberance guide being formed on the lever; and
   a protuberance projecting from the housing and operatively engaging the protuberance guide, said protuberance and said protuberance guide permitting a rotation of said lever around the central pivot point.

10. The apparatus according to claim 5, wherein the operating point is a protuberance being inserted into the operating point guide.

11. The apparatus according to claim 5, wherein the lever further includes a locking piece extending in a direction toward a receiving space within said housing for said module, said locking piece capable of locking said module within said receiving space.

12. An apparatus for receiving a module in a computer comprising:
   a housing for receiving a module;
   a lever, said lever including a separating lever formed on a first side of the housing and to which external force is applied by a user, and a semicircular cam having a semicircular shape and extending from the separating lever;
   a locking piece having a locking cam projecting from a first side and capable of contacting the module and affixing the module in a locked position, said locking piece having a inclined cam for receiving the external force;
   a cooperating lever arm being formed in an elongated shape, said lever arm having a first cam portion for receiving external force by contacting the semicircular cam and a second cam portion for delivering the external force to the locking cam; and a pushing arm for receiving the external force from the semicircular cam and for providing a releasing force capable of pushing and separating the module to release the locking cam from engaging the module in the locked position.

13. The apparatus according to claim 12, further comprising a spring whose one end comes into contact with the cooperating lever arm and whose other end comes into contact with the housing, for maintaining stopping position of the cooperating lever arm.

14. The apparatus according to claim 12, further comprising a spring having a first end contacting the locking piece and a second end contacting the housing for maintaining a stopping position of the locking piece.

* * * * *